United States Patent
Tabuchi (10) Patent No.: US 10,487,397 B2
(45) Date of Patent: Nov. 26, 2019

(54) GAS-BARRIER PLASTIC MOLDED PRODUCT AND METHOD FOR MANUFACTURING SAME

(71) Applicant: KIRIN COMPANY, LIMITED, Tokyo (JP)

(72) Inventor: Hiroyasu Tabuchi, Tokyo (JP)

(73) Assignee: KIRIN HOLDINGS KABUSHIKI KAISHA, Nakano-Ku, Tokyo (JP)

( * ) Notice: Subject to any disclaimer, the term of this patent is extended or adjusted under 35 U.S.C. 154(b) by 0 days.

(21) Appl. No.: 15/566,515

(22) PCT Filed: Apr. 5, 2016

(86) PCT No.: PCT/JP2016/061070
§ 371 (c)(1),
(2) Date: Oct. 13, 2017

(87) PCT Pub. No.: WO2016/167152
PCT Pub. Date: Oct. 20, 2016

(65) Prior Publication Data
US 2018/0127872 A1    May 10, 2018

(30) Foreign Application Priority Data
Apr. 17, 2015 (JP) .................. 2015-085018

(51) Int. Cl.
*C23C 16/30* (2006.01)
*B65D 23/02* (2006.01)
(Continued)

(52) U.S. Cl.
CPC ............ *C23C 16/30* (2013.01); *B65D 23/02* (2013.01); *C23C 16/045* (2013.01); *C23C 16/44* (2013.01); *C23C 16/448* (2013.01)

(58) Field of Classification Search
USPC ................................. 428/446, 698
See application file for complete search history.

(56) References Cited

U.S. PATENT DOCUMENTS

2003/0141499 A1* 7/2003 Venkatraman .......... C23C 14/10
257/40
2004/0253451 A1* 12/2004 Kawashima ............ C23C 16/30
428/411.1
(Continued)

FOREIGN PATENT DOCUMENTS

JP      2004-107689 A    4/2004
JP      2009-120885 A    6/2009
(Continued)

OTHER PUBLICATIONS

Nakaya et al "Novel Gas Barrier SiOC Coating to PET Bottles through a Hot Wire CVD Method". Journal of Polymers vol. 2016, article ID 4657193 p. 1-7 (Year: 2016).*
(Continued)

*Primary Examiner* — Archene A Turner
(74) *Attorney, Agent, or Firm* — Sughrue Mion, PLLC (57) ABSTRACT

An object of the present disclosure is to provide a gas barrier plastic molded body which is excellent in gas barrier properties and transparency and a method for producing the same. A gas barrier plastic molded body 90 according to the present disclosure includes a plastic molded body 91 and a gas barrier thin film 92 provided on a surface of the plastic molded body 91, and in the gas barrier plastic molded body, the gas barrier thin film 92 contains silicon (Si), carbon (C), and oxygen (O) as constituent elements and has a region, in a which a main peak is observed, at a peak appearance position of binding energy of Si—C when the gas barrier thin film is subjected to an X-ray photoelectron spectroscopic analysis under Condition (1). Condition (1): a measurement range is set to 95 to 105 eV.

3 Claims, 5 Drawing Sheets

(51) Int. Cl.
  *C23C 16/44* (2006.01)
  *C23C 16/04* (2006.01)
  *C23C 16/448* (2006.01)

(56) References Cited

U.S. PATENT DOCUMENTS

| | | | |
|---|---|---|---|
| 2011/0274933 A1* | 11/2011 | Hoshi | B32B 27/08 428/446 |
| 2012/0101221 A1* | 4/2012 | Hoshi | C23C 14/48 524/588 |
| 2012/0205279 A1 | 8/2012 | Mishima et al. | |
| 2013/0316108 A1 | 11/2013 | Shimizu et al. | |
| 2013/0323423 A1* | 12/2013 | Nakaya | C23C 16/045 427/255.29 |
| 2014/0366806 A1 | 12/2014 | Ooshima et al. | |

FOREIGN PATENT DOCUMENTS

| | | |
|---|---|---|
| JP | 2013-022923 A | 2/2013 |
| JP | 2014-005071 A | 1/2014 |
| TW | 201325896 A | 7/2013 |
| WO | 2006/126677 A1 | 11/2006 |
| WO | 2012/091095 A1 | 7/2012 |
| WO | 2012/091097 A1 | 7/2012 |
| WO | 2013/099960 A1 | 7/2013 |

OTHER PUBLICATIONS

International Search Report for PCT/JP2016/061070 dated Jul. 5, 2016 [PCT/ISA/210].
Written Opinion for PCT/JP2016/061070 dated Jul. 5, 2016 [PCT/ISA/237].
International Preliminary Report on Patentability with the Translation of the Written Opinion dated Oct. 26, 2017 from the International Bureau, issued in International Application No. PCT/JP2016/061070.
Communication dated Nov. 20, 2018, issued by the European Patent Office in corresponding EP Application No. 16779943.6.
Communication dated Jul. 19, 2019, issued by the Taiwanese Patent Office in application No. 105111263.

* cited by examiner

GAS-BARRIER PLASTIC MOLDED PRODUCT AND METHOD FOR MANUFACTURING SAME

CROSS REFERENCE TO RELATED APPLICATIONS

This application is a National Stage of International Application No. PCT/JP2016/061070 filed Apr. 5, 2016, claiming priority based on Japanese Patent Application No. 2015-085018 filed Apr. 17, 2015, the contents of all of which are incorporated herein by reference in their entirety.

TECHNICAL FIELD

The present disclosure relates to a gas barrier plastic molded body and a method for producing the same.

BACKGROUND ART

Hitherto, as a technology of forming a thin film having gas barrier properties (hereinafter, also referred to as a gas barrier thin film in some cases), a heat generation element CVD method is known. The heat generation element CVD method is also called a Cat-CVD method or a hot wire CVD method and is a method of decomposing a raw material gas by bringing the raw material gas into contact with a heat generation element that has been caused to generate heat, and depositing the chemical species thus produced as a thin film on a surface of a plastic molded body directly or after a reaction process in a gas phase (for example, see Patent Literature 1).

CITATION LIST

Patent Literature

Patent Literature 1: WO 2012/091097 A
Patent Literature 2: WO 2013/099960 A

SUMMARY OF INVENTION

Technical Problem

High transparency in the plastic molded body is required in some cases in addition to high gas barrier properties. In the method described in Patent Literature 1, gas barrier properties are excellent but transparency is not sufficient.

An object of the present disclosure is to provide a gas barrier plastic molded body which is excellent in gas barrier properties and transparency and a method for producing the same.

Solution to Problem

A gas barrier plastic molded body according to the present invention includes a plastic molded body and a gas barrier thin film provided on a surface of the plastic molded body, wherein the gas barrier thin film contains silicon (Si), carbon (C), and oxygen (O) as constituent elements and has a region, in which a main peak is observed, at a peak appearance position of binding energy of Si—C when the gas barrier thin film is subjected to an X-ray photoelectron spectroscopic analysis under Condition (1):
Condition (1): a measurement range is set to 95 to 105 eV.
In the gas barrier plastic molded body according to the present invention, it is preferable that the gas barrier thin film have a gradient composition in a depth direction, and when the gas barrier thin film is bisected in the depth direction so that an opposite side to the plastic molded body is regarded as an upper layer and the plastic molded body side is regarded as a lower layer, a C content percentage represented by (Mathematical Formula 1) in the upper layer is higher than a Si content percentage represented by (Mathematical Formula 2) in the upper layer:

C content percentage [%]={(C content [atomic %])/(total content of Si, O, and C [atomic %])}×100  (Mathematical Formula 1)

in Mathematical Formula 1, the content of Si, O, or C is a content thereof in the items of the three elements of Si, O, and C, Si content percentage [%]={(Si content [atomic %])/(total content of Si, O, and C [atomic %])}×100  (Mathematical Formula 2)

in Mathematical Formula 2, the content of Si, O, or C is a content thereof in the items of the three elements of Si, O, and C.

In the gas barrier plastic molded body according to the present invention, it is preferable that an O content percentage represented by (Mathematical Formula 3) in the upper layer is lower than the Si content percentage in the upper layer:

O content percentage [%]={(O content [atomic %])/(total content of Si, O, and C [atomic %])}×100  (Mathematical Formula 3)

in Mathematical Formula 3, the content of Si, O, or C is a content thereof in the items of the three elements of Si, O, and C.

In the gas barrier plastic molded body according to the present invention, it is preferable that the gas barrier thin film have a gradient composition in a depth direction, and when the gas barrier thin film is bisected in the depth direction so that an opposite side to the plastic molded body is regarded as an upper layer and the plastic molded body side is regarded as a lower layer, a C content percentage represented by (Mathematical Formula 1) in the lower layer is higher than an O content percentage represented by (Mathematical Formula 3) in the lower layer. When the C content percentage in the lower layer is set to be higher than the O content percentage, the adhesiveness between the thin film and the plastic molded body can be enhanced.

C content percentage [%]={(C content [atomic %])/(total content of Si, O, and C [atomic %])}×100  (Mathematical Formula 1)

In Mathematical Formula 1, the content of Si, O, or C is a content thereof in the items of the three elements of Si, O, and C.

O content percentage [%]={(O content [atomic %])/(total content of Si, O, and C [atomic %])}×100  (Mathematical Formula 3)

In Mathematical Formula 3, the content of Si, O, or C is a content thereof in the items of the three elements of Si, O, and C.

A method for producing a gas barrier plastic molded body according to the present invention, includes an exhausting step of exhausting the gas in the inside of a vacuum chamber to adjust the inside of the vacuum chamber to an initial pressure $P_0$ or less; a preparing step of, when the pressure in the vacuum chamber is adjusted to $P_0$ or less and a heat generation element, which has a tantalum carbide phase, disposed in the vacuum chamber is not heated, introducing a silicon-containing hydrocarbon gas into the vacuum chamber to adjust the pressure in the vacuum chamber to the $P_0$; and a film forming step of forming a gas barrier thin film on a surface of a plastic molded body accommodated in the vacuum chamber by heating the heat generation element while the silicon-containing hydrocarbon gas is continuously introduced into the vacuum chamber.

In the method for producing a gas barrier plastic molded body according to the present invention, in the preparing step, it is preferable that the pressure in the vacuum chamber is adjusted to the $P_0$ and then the pressure in the vacuum chamber is caused to reach higher pressure $P_A$ than the $P_0$, and in the film forming step, it is preferable that the pressure in the vacuum chamber is caused to reach higher pressure $P_B$ than the $P_A$.

In the method for producing a gas barrier plastic molded body according to the present invention, it is preferable that $(P_B-P_A)/P_0$ is 0.11 or more.

Advantageous Effects of Invention

The present disclosure can provide a gas barrier plastic molded body which is excellent in gas barrier properties and transparency and a method for producing the same.

DESCRIPTION OF EMBODIMENTS

Next, the present invention will be described in detail by way of embodiments, but the present invention is not construed to be limited to these descriptions. As long as the effects of the present invention are provided, various modifications of the embodiments may be made.

Figure 1:
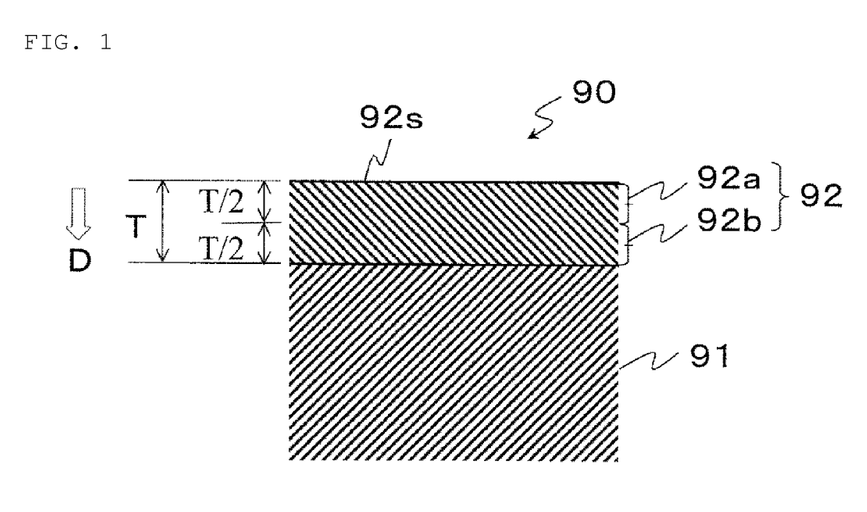
FIG. 1 is a cross-sectional view illustrating an example of a gas barrier plastic molded body according to the present embodiment.

FIG. 1 is a cross-sectional view illustrating an example of a gas barrier plastic molded body according to the present embodiment. A gas barrier plastic molded body 90 according to the present embodiment includes a plastic molded body 91 and a gas barrier thin film 92 provided on a surface of the plastic molded body 91, and in the gas barrier plastic molded body, the gas barrier thin film 92 contains silicon (Si), carbon (C), and oxygen (O) as constituent elements and has a region, in which a main peak is observed, at a peak appearance position of binding energy of Si—C when the gas barrier thin film is subjected to an X-ray photoelectron spectroscopic analysis under Condition (1).

Condition (1): a measurement range is set to 95 to 105 eV.

Examples of a resin that constitutes the plastic molded body 91 include a polyethylene terephthalate resin (PET), a polybutylene terephthalate resin, a polyethylene naphthalate resin, a polyethylene resin, a polypropylene resin (PP), a cycloolefin copolymer resin (COC, cyclic olefin copolymer), an ionomer resin, a poly-4-methylpentene-1 resin, a polymethyl methacrylate resin, a polystyrene resin, an ethylene-vinyl alcohol copolymer resin, an acrylonitrile resin, a polyvinyl chloride resin, a polyvinylidene chloride resin, a polyamide resin, a polyamideimide resin, a polyacetal resin, a polycarbonate resin, a polysulfone resin, a tetrafluoroethylene resin, an acrylonitrile-styrene resin, and an acrylonitrile-butadiene-styrene resin. These can be used as a single layer of one kind or as a laminate of two or more kinds, but in view of productivity, a single layer is preferable. In addition, the kind of the resin is more preferably PET.

In the gas barrier plastic molded body 90 according to present embodiment, the plastic molded body 91 includes the form of a container, a film, or a sheet. The shape thereof can be appropriately set in accordance with the purpose and use and is not particularly limited. The container includes a container used after being covered with a lid, stoppered, or sealed, or a container used in an open state without using those coverings. The size of the opening can be appropriately set in accordance with the content. A plastic container includes a plastic container having appropriate rigidity and a predetermined thickness and a plastic container formed using a sheet material which does not have rigidity. The present invention is not limited to the method for producing a container. Examples of the content include beverages such as water, tea beverages, soft drinks, carbonated beverages, and fruit juice beverages; and foods in the form of a liquid, a viscous material, a powder, or a solid. Furthermore, the container may be any of a returnable container or a one-way container. The film or sheet includes a long sheet-like object or a cut sheet. It does not matter whether the film or sheet is a stretched product or an unstretched product. The present invention is not limited to the method for the producing the plastic molded body 91.

The thickness of the plastic molded body 91 can be appropriately set in accordance with the purpose and use, and is not particularly limited. When the plastic molded body 91 is, for example, a container such as a bottle for beverages, the thickness of the bottle is preferably 50 to 500 μm and more preferably 100 to 350 μm. Furthermore, when the plastic molded body 91 is a film that constitutes a packaging bag, the thickness of the film is preferably 3 to 300 μm and more preferably 10 to 100 μm. When the plastic molded body 91 is a substrate for a flat panel display such as electronic paper or organic EL, the thickness of the film is preferably 25 to 200 μm and more preferably 50 to 100 μm. When the plastic molded body 91 is a sheet for forming a container, the thickness of the sheet is preferably 50 to 500 μm and more preferably 100 to 350 μm. Further, when the plastic molded body 91 is a container, the gas barrier thin film 92 is provided on any one side or on both sides of the inner wall surface and the outer wall surface of the container. Furthermore, when the plastic molded body 91 is a film, the gas barrier thin film 92 is provided on one surface or on both surfaces.

The gas barrier thin film 92 contains silicon (Si), carbon (C), and oxygen (O) as constituent elements and has a region, in which a main peak is observed, at a peak appearance position of binding energy of Si—C when the gas barrier thin film is subjected to an X-ray photoelectron spectroscopic analysis under Condition (1).

Condition (1): a measurement range is set to 95 to 105 eV.

By having the region, in which a main peak is observed, at the peak appearance position of binding energy of Si—C, the gas barrier thin film 92 becomes a thin film excellent in transparency. In the present specification, the main peak means a peak having the highest intensity among the peaks observed after peak separation under Condition (1).

The binding form of a compound contained in the gas barrier thin film 92 is, for example, a Si—Si bond, a Si—H bond, a Si—O bond, a C—H bond, a C—C bond, a C—O bond, a C=O bond, a Si—O—C bond, a C—O—C bond, an O—C—O bond, or an O=C—O bond, in addition to a Si—C bond.

In the gas barrier plastic molded body according to the present embodiment, when the gas barrier thin film 92 is subjected to an X-ray photoelectron spectroscopic analysis under Condition (1), the peak observed at the peak appearance position of binding energy of Si—C is preferably larger than a peak observed at a peak appearance position of binding energy of Si—Si. According to this, transparency can be further enhanced.

In the gas barrier plastic molded body 90 according to the present embodiment, it is preferable that the gas barrier thin film have a gradient composition in a depth direction, and when the gas barrier thin film 92 is bisected in a depth direction D so that an opposite side to the plastic molded body 91 is regarded as an upper layer 92a and the plastic molded body 91 side is regarded as a lower layer 92b, a C content percentage represented by (Mathematical Formula 1) in the upper layer 92a is higher than a Si content percentage represented by (Mathematical Formula 2) in the upper layer 92a (Condition 1). According to this, transparency can be further enhanced.

C content percentage [%]={(C content [atomic %])/
(total content of Si, O, and C
[atomic %])}×100 (Mathematical Formula 1)

In Mathematical Formula 1, the content of Si, O, or C is a content thereof in the items of the three elements of Si, O, and C.

Si content percentage [%]={(Si content [atomic %])/
(total content of Si, O, and C
[atomic %])}×100 (Mathematical Formula 2)

In Mathematical Formula 2, the content of Si, O, or C is a content thereof in the items of the three elements of Si, O, and C.

The upper layer 92a is a portion having a thickness T/2 [nm] from a surface 92s of the gas barrier thin film 92 when the film thickness of the gas barrier thin film 92 is designated as T [nm]. The lower layer 92b is a portion between the upper layer 92a and the plastic molded body 91, namely the lower layer 92b is the portion having a thickness T/2 [nm] from an interface between the gas barrier thin film 92 and the plastic molded body 91.

In the gas barrier plastic molded body 90 according to the present embodiment, the film thickness T of the gas barrier thin film 92 is preferably 5 nm or more. The film thickness T is more preferably 10 nm or more. When the film thickness T is less than 5 nm, the gas barrier properties are not sufficient in some cases. In addition, the upper limit of the film thickness of the gas barrier thin film 92 is preferably set to 200 nm. The upper limit is more preferably 100 nm. When the film thickness of the gas barrier thin film 92 is more than 200 nm, cracks easily occur due to internal stress.

The gas barrier thin film 92 has a gradient composition in the depth direction D. The depth direction D is, as illustrated in FIG. 1, a direction from the surface 92s of the gas barrier thin film 92 toward the plastic molded body 91. The gradient composition indicates a composition in which the content of at least one of Si, O, and C changes continuously or stepwise in the depth direction D. The fact that the gas barrier thin film 92 has the gradient composition in the depth direction D does not indicate that the upper layer 92a and the lower layer 92b each have an independent gradient composition but indicates that both the upper layer 92a and the lower layer 92b have a series of gradient compositions without any clear boundary between the layers. The gradient composition is inclined all over the upper layer 92a and the lower layer 92b or a part of the upper layer 92a or the lower layer 92b may have a non-inclined part. Incidentally, the fact that the gas barrier thin film 92 has the gradient composition in the depth direction D can be confirmed by measuring a depth profile while argon ion etching is performed in an XPS analysis.

In the gas barrier plastic molded body 90 according to the present embodiment, it is preferable that an O content percentage represented by (Mathematical Formula 3) in the upper layer 92a is lower than the Si content percentage represented by (Mathematical Formula 2) in the upper layer 92a (Condition 2). By providing Condition 2 in addition to Condition 1, the C content percentage in the upper layer 92a is the highest, the Si content percentage is the secondary highest, and the O content percentage is the lowest so that transparency can be further enhanced.

O content percentage [%]={(O content [atomic %])/
(total content of Si, O, and C
[atomic %])}×100 (Mathematical Formula 3)

In Mathematical Formula 3, the content of Si, O, or C is a content thereof in the items of the three elements of Si, O, and C.

The C content percentage in the upper layer 92a is preferably 40 to 60% and more preferably 43 to 58%. The Si content percentage in the upper layer 92a is preferably 20 to 40% and more preferably 25 to 38%. The O content percentage in the upper layer 92a is preferably 5 to 30% and more preferably 7 to 28%. The Si content percentage, the C content percentage, or the O content percentage can be measured by, for example, subjecting the gas barrier thin film 92 to an XPS analysis.

In the gas barrier plastic molded body according to the present embodiment, it is preferable that the C content percentage represented by (Mathematical Formula 1) in the lower layer 92b is higher than the O content percentage represented by (Mathematical Formula 3) in the lower layer 92b (Condition 3). When the C content percentage in the lower layer 92b is set to be higher than the O content percentage, the adhesiveness between the thin film and the plastic molded body can be enhanced.

The high-low relationship among the Si content percentage, the O content percentage, and the C content percentage in Conditions 1 to 3 is determined by selecting one profile having one extreme value in each of the upper layer and the lower layer from a Si profile, an O profile, and a C profile in the depth profile of the gas barrier thin film and then using the high-low relationship of Si, O, or C atomic concentration in each extreme value of the upper layer or the lower layer of the selected profile (Determination Criterion 1). In Determination Criterion 1, when there are a plurality of profiles each having one extreme value in each of the upper layer and the lower layer, the priority order for selection is the order of the O profile, the C profile, and the Si profile. Alternatively, the high-low relationship among the Si content percentage, the O content percentage, and the C content percentage in Conditions 1 to 3 is determined by the high-low relationship among the Si content percentage, the O content percentage, and the C content percentage in the whole upper layer or the whole lower layer (Determination Criterion 2). In Determination Criterion 2, the Si content percentage, the O content percentage, and the C content percentage in the whole upper layer or lower layer can be obtained as atomic concentration integrated values in the upper layer or the lower layer of each profile of Si, O, and C in the depth profile of the gas barrier thin film, for example. In the present embodiment, when Condition 1 is satisfied in at least any one of Determination Criterion 1 and Determination Criterion 2, it is determined that Condition 1 is established. When Condition 1 is satisfied in both Determination Criterion 1 and Determination Criterion 2, it is also naturally determined that Condition 1 is established. Also, regarding Condition 2 or Condition 3, whether Condition 2 or Condition 3 is established is determined in the similar manner to Condition 1.

The gas barrier thin film 92 may contain other elements in addition to Si, C, and O. The other elements are, for example, a metal element derived from a heat generation element such as tantalum (Ta); hydrogen (H); or nitrogen (N).

The gas barrier thin film 92 is preferably substantially colorless and transparent. In the present specification, being substantially colorless and transparent means that when the degree of coloration b* value, which is a color difference according to JIS K 7105-1981 "Testing methods for optical properties of plastics," is used as an index, the b* value is 2.0 or less. The b* value is more preferably 1.7 or less. The b* value can be determined by Mathematical Formula 4. Incidentally, in Mathematical Formula 4, Y or Z is a tristimulus value. Further, the correlation by visual inspection with the b* value in the present invention is approximately as presented in Table 1.

$$b^* = 200[(Y/Y_0)^{1/3} - (Z/Z_0)^{1/3}]$$ [Mathematical Formula 4]

TABLE 1

| b * Value | 0~2 | 2~4 | 4~6 | 6~8 | 8~ |
|---|---|---|---|---|---|
| Expression by visual inspection | Colorless | Very light yellowish brown | Light yellowish brown | Slightly dark yellowish brown | Dark yellowish brown |

The gas barrier plastic molded body 90 according to the present embodiment has a barrier improvement factor (hereinafter, referred to as BIF), which is determined by Mathematical Formula 5, is preferably 5 or more. The barrier improvement factor is more preferably 10 or more. As a specific example, in a 500-ml PET bottle (height: 133 mm, outer diameter of the cylinder: 64 mm, outer diameter of the opening: 24.9 mm, inner diameter of the opening: 21.4 mm, thickness: 300 µm, and resin amount: 29 g), the oxygen permeability can be set to 0.0070 cc/container/day or less. In a 720-ml PET bottle, the oxygen permeability can be set to 0.0098 cc/container/day or less.

BIF=[oxygen permeability of a plastic molded body without a thin film formed therein]/[oxygen permeability of a gas barrier plastic molded body] (Mathematical Formula 5)

Figure 2:
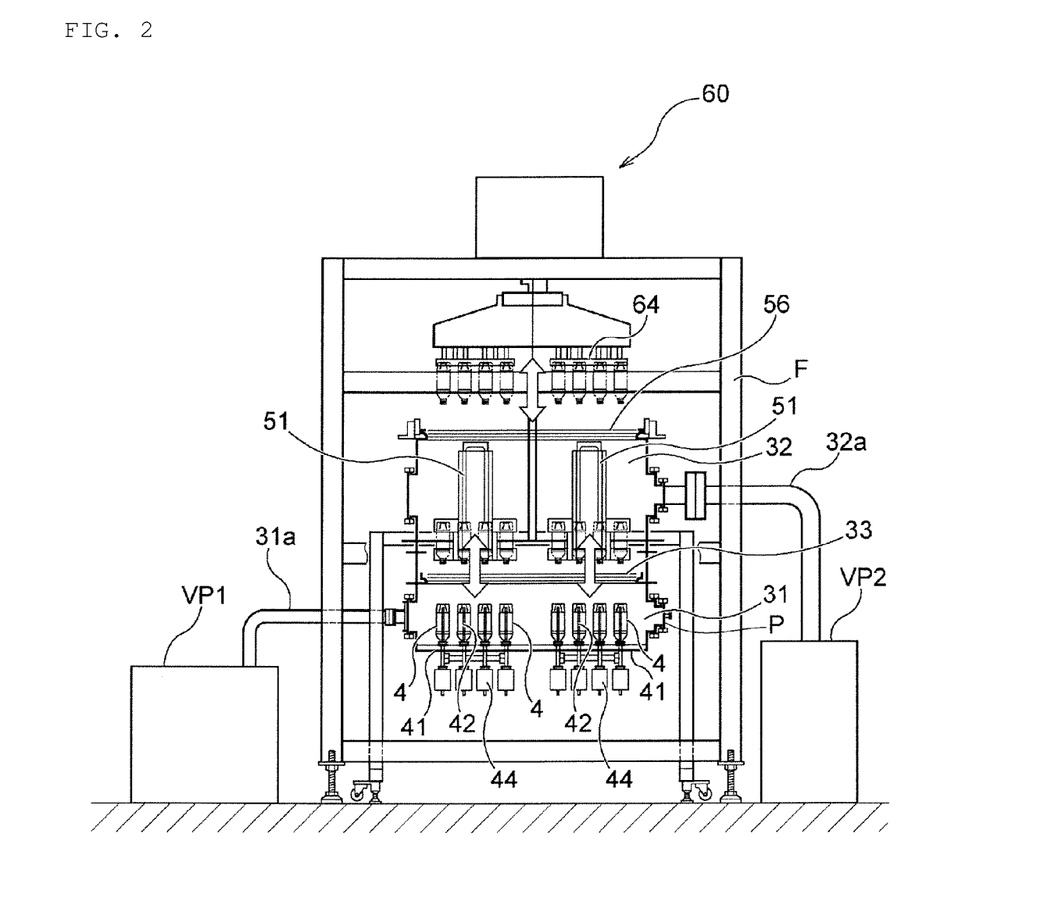
FIG. 2 is a schematic diagram illustrating an example of a conventional film forming apparatus.

The gas barrier plastic molded body according to the present embodiment can be produced by, for example, a conventional film forming apparatus as illustrated in FIG. 2. The film forming apparatus illustrated in FIG. 2 is an apparatus illustrated in FIG. 3 of WO 2013/099960 A (Patent Literature 2) and the details of the apparatus are described in WO 2013/099960 A. Herein, the film forming apparatus will be simply described using FIG. 2.

The film forming apparatus includes a film formation dedicated chamber 31 for forming a plastic molded body (a plastic bottle in FIG. 2) 4 and an insertion/extraction chamber 32 for inserting and extracting the plastic molded body 4, and a gate valve 33 is provided between the film formation dedicated chamber 31 and the insertion/extraction chamber 32.

The film formation dedicated chamber 31 has a reaction chamber, which forms a thin film on the surface of the plastic molded body 4, inside thereof. A heat generation element 42 and a raw material gas supply pipe (not illustrated) are disposed in the reaction chamber. The gas in the inside of the reaction chamber can be exhausted by a vacuum pump VP1.

The insertion/extraction chamber 32 has a standby chamber, which keeps the plastic molded body 4 before the film formation on standby, inside thereof. The gas in the inside of the standby chamber can be exhausted by a vacuum pump VP2. The insertion/extraction chamber 32 has an open/close gate 56. By opening the open/close gate 56, the plastic molded body 4 before the film formation can be introduced into the standby chamber or the plastic molded body 4 after the film formation can be extracted from the standby chamber.

The gate valve 33 is a partition between the film formation dedicated chamber 31 and the insertion/extraction chamber 32.

Next, with reference to FIG. 2, the method for producing a gas barrier plastic molded body according to the present embodiment will be described by illustrating, as an example, a case in which a gas barrier thin film is formed on an inner surface of a plastic bottle as the plastic molded body 4. The present invention is not limited to the apparatus, and for example, as illustrated in FIG. 2 of Patent Literature 1, an apparatus including only one chamber may be used.

A method for producing a gas barrier plastic molded body according to a first embodiment includes: an exhausting step of exhausting the gas in the inside of the vacuum chamber (the film formation dedicated chamber in FIG. 2) 31 to adjust the inside of the vacuum chamber 31 to an initial pressure $P_0$ or less; a preparing step of, when the pressure in the vacuum chamber 31 is adjusted to $P_0$ or less and the heat generation element 42, which has a tantalum carbide phase, disposed in the vacuum chamber 31 is not heated, introducing a silicon-containing hydrocarbon gas into the vacuum chamber 31 to adjust the pressure in the vacuum chamber 31 to $P_0$; and a film forming step of forming a gas barrier thin film on the surface of the plastic molded body (the plastic bottle in FIG. 2) 4 accommodated in the vacuum chamber 31 by heating the heat generation element 42 while the silicon-containing hydrocarbon gas is continuously introduced into the vacuum chamber 31.

In the exhausting step, the gate valve 33 and the open/close gate 56 are in the close state. The air in the vacuum chamber (the film formation dedicated chamber) 31 is exhausted by operating the vacuum pump VP1 to adjust the inside of the vacuum chamber 31 to the initial pressure $P_0$ or less. The initial pressure $P_0$ is preferably 1.5 Pa and more preferably 1.0 Pa. In addition, the lower limit of the pressure in the vacuum chamber 31 in the exhausting step is not particularly limited.

In the exhausting step, it is preferable that the air in the insertion/extraction chamber 32 is exhausted by operating the vacuum pump VP2 in association with the exhausting the gas in the inside of the vacuum chamber 31. At this time, the pressure in the insertion/extraction chamber 32 may be set to be higher or lower than the pressure in the vacuum chamber 31.

It is preferable to start the preparing step in the apparatus illustrated in FIG. 2 when the gate valve 33 is opened to communicate the vacuum chamber 31 to the insertion/extraction chamber 32. When the gate valve 33 is opened, the pressure in the vacuum chamber 31 becomes equal to the pressure in the insertion/extraction chamber 32.

In the preparing step, a silicon-containing hydrocarbon gas is introduced while the gas in the inside of the vacuum chamber 31 is exhausted to adjust the pressure in the vacuum chamber 31 to $P_0$. When the silicon-containing hydrocarbon gas is introduced, the pressure in the vacuum chamber 31 is rapidly increased so that the pressure in the vacuum chamber 31 largely exceeds $P_0$ (for example, exceeds $P_B$) at the initial stage of the preparing step in some cases. In this case, it is preferable that the gas in the inside of the vacuum chamber 31 is exhausted to adjust the pressure in the vacuum chamber 31 not to be a large pressure exceeding, for example, $P_B$. In addition, the pressure in the vacuum chamber 31 may be adjusted to be less than $P_0$ in the exhausting step such that the pressure in the vacuum chamber 31 in the preparing step does not become a large pressure exceeding, for example, $P_B$. The pressure in the vacuum chamber 31 is adjusted by, for example, controlling the flow rate of the silicon-containing hydrocarbon gas. By using the silicon-containing hydrocarbon gas, it is possible to form a substantially colorless and transparent gas barrier thin film. The silicon-containing hydrocarbon gas is a gas to be used as a raw material gas in the film forming step, and for example, silicon tetrachloride; an organic silane compound such as hexamethyl disilane, vinyl trimethyl silane, methyl silane, dimethyl silane, trimethyl silane, vinylsilane, diethyl silane, propyl silane, phenyl silane, methyl triethoxy silane, vinyl triethoxy silane, vinyl trimethoxy silane, tetramethoxy silane, tetraethoxy silane, phenyl trimethoxy silane, methyl trimethoxy silane, or methyl triethoxy silane; an organic siloxane compound such as octamethylcyclotetrasiloxane, 1,1,3,3-tetramethyldisiloxane, tetraethoxy silane, or hexamethyldisiloxane; or an organic silazane compound such as hexamethylsilazane is used. Further, in addition to these materials, aminosilane or the like is also used. Among these silicon-containing hydrocarbons, an organic silane compound not containing oxygen or nitrogen as a constituent element is preferable, and from the viewpoint of having a higher percentage of carbon than that of silicon in the constituent elements and easily using a material like handling the material as a gas at normal temperature and normal pressure, vinylsilane, dimethyl silane, trimethyl silane, or tetramethyl silane is particularly preferable.

It is preferable that the plastic molded body 4 disposed in the insertion/extraction chamber 32 is descended to reach a predetermined position near the heat generation element 42 until the completion of the preparing step. A timing when the preparing step is completed is a timing when the inside of the vacuum chamber 31 reaches a predetermined pressure. The predetermined pressure is preferably a pressure $P_A$ higher than $P_0$. In addition, the state in which the plastic molded body 4 reaches a predetermined position near the heat generation element 42 is a state in which the heat generation element 42 and a raw material gas supply pipe (not illustrated) are inserted in a plastic bottle as illustrated in FIG. 2, for example, when a film is formed on the inner surface of the plastic bottle as the plastic molded body 4.

In the film forming step, the gas barrier thin film is formed on the surface of the plastic molded body 4 by heating the heat generation element 42 while the silicon-containing hydrocarbon gas is continuously introduced into the vacuum chamber 31.

The heat generation element 42 is heated by, for example, applying electricity. The heat generation element 42 has a tantalum carbide phase. By using the heat generation element 42 having a tantalum carbide phase, it is possible to form a substantially colorless and transparent gas barrier thin film. The tantalum carbide phase is, for example, a tantalum, a tantalum base alloy, tantalum containing an additive, or a carbide in which a tantalum base alloy is carbonized. In addition, the tantalum carbide phase may contain $Ta_2C$ and $TaC$, for example. The tantalum carbide phase may exist all over the heat generation element 42 or exist on a part of the heat generation element 42. The form in which the tantalum carbide phase exists on a part of the heat generation element 42 is, for example, the form in which the heat generation element 42 has a center part and an edge part and the tantalum carbide phase exists only on the edge part of the heat generation element 42. At this time, the center part preferably has a metal tantalum phase. The heating temperature of the heat generation element 42 is not particularly limited, but is preferably 1600° C. or higher and lower than 2400° C., more preferably 1850° C. or higher and lower than 2350° C., and further preferably 2000° C. or higher and 2200° C. or lower.

In the first embodiment, the heat generation element 42 is first heated in the film forming step and the heat generation element 42 is not heated in the exhausting step and the preparing step. The gas remaining in the vacuum chamber 31 is only atmospheric air before the completion of the preparing step, and when the heat generation element 42 is heated under such an atmosphere, the heat generation element 42 easily undergoes oxidation degradation. In addition, in order to enable the heat generation element CVD method to be used, for example, in an actual manufacturing line such as coating of a plastic bottle, it is required to repeatedly use the heat generation element. When the heat generation element is repeatedly used, for example, more than 10,000 times, there is a problem in that the heat generation element is deformed due to oxidation degradation or the catalytic activity of the heat generation element is lost so that a thin film having high gas barrier properties cannot be formed. In this regard, in the first embodiment, the oxidation degradation of the heat generation element 42 can be suppressed by heating the heat generation element 42 under the atmosphere in which the inside of the vacuum chamber 31 is properly filled with the silicon-containing hydrocarbon gas. As a result, even when the heat generation element is repeatedly used, for example, more than 10,000 times, it is possible to prevent the heat generation element 42 from being deformed due to oxidation degradation.

Figure 3:
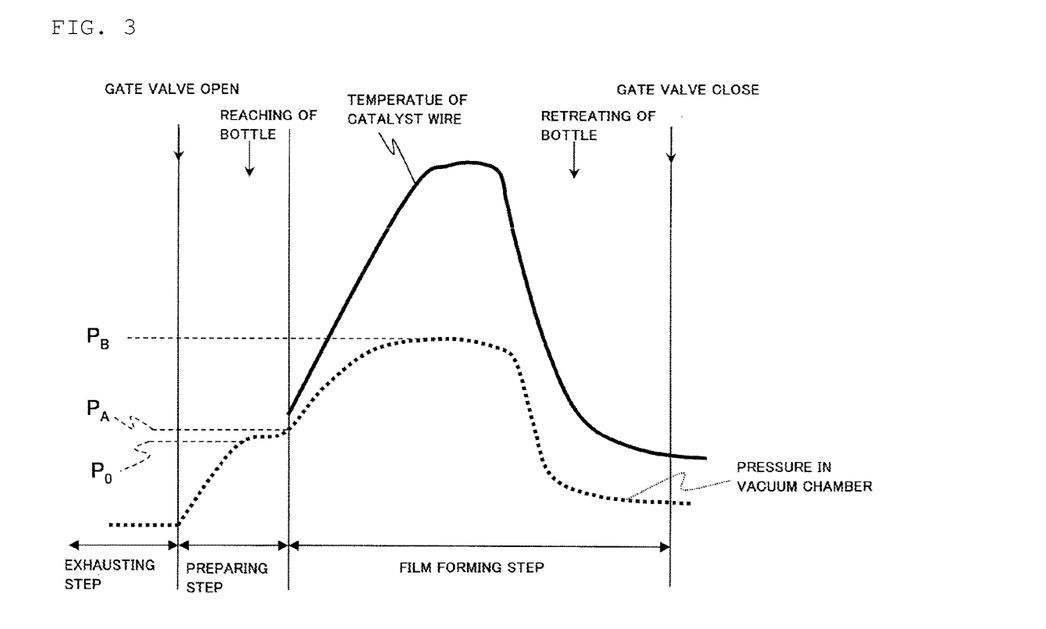
FIG. 3 is a conceptual diagram illustrating an example of a pressure change in a vacuum chamber and a temperature change of a heat generation element in a production method according to the present embodiment.

FIG. 3 is a conceptual diagram illustrating an example of a pressure change in a vacuum chamber and a temperature change of a heat generation element in a production method according to the present embodiment. In the method for producing a gas barrier plastic molded body according to the first embodiment, as illustrated in FIG. 3, it is preferable that in the preparing step, the pressure in the vacuum chamber 31 is adjusted to $P_0$ and then the pressure in the vacuum chamber 31 is caused to reach the pressure $P_A$ higher than $P_0$, and in the film forming step, the pressure in the vacuum chamber 31 is caused to reach a pressure $P_B$ higher than $P_A$. It is possible to form a gas barrier thin film having high transparency and high gas barrier properties.

In the method for producing a gas barrier plastic molded body according to the first embodiment, $(P_B-P_A)/P_0$ is preferably 0.11 or more. $(P_B-P_A)/P_0$ is more preferably 0.15 or more. Thus, it is possible to form a gas barrier thin film having high transparency and high gas barrier properties. The upper limit of $(P_B-P_A)/P_0$ is not particularly limited, but is preferably 0.67 or less and more preferably 0.34 or less.

The pressures $P_0$, $P_A$, and $P_B$ are pressures detected by a pressure detector 80. The pressure detector 80 is preferably provided at a lower chamber port portion P as illustrated in FIG. 2.

The heating of the heat generation element 42 is stopped when a thin film having a predetermined film thickness is formed on the surface of the plastic molded body 4, the obtained gas barrier plastic molded body is returned to the insertion/extraction chamber 32, the gate valve 33 is then closed so that the film forming step is completed.

After the film forming step, the inside of the insertion/extraction chamber 32 is exposed to the atmospheric air by operating a vacuum breaking valve (not illustrated) disposed in the insertion/extraction chamber 32. At this time, it is preferable that the inside of the vacuum chamber 31 is kept in a vacuum state at all times and the heat generation element 42 disposed in the vacuum chamber 31 is kept in a vacuum state at all times.

Next, the open/close gate 56 is opened to extract the gas barrier plastic molded body and a new untreated plastic molded body is introduced. Then, the open/close gate 56 is closed and then the exhausting step, the preparing step, and the film forming step are repeated.

Hereinbefore, the method for producing a gas barrier plastic molded body which has a substantially colorless and transparent gas barrier thin film has been described; however, a case in which the high degree of transparency of the gas barrier thin film is not required much (for example, b* is more than 2 and 6 or less) will be described.

A method for producing a gas barrier plastic molded body according to a second embodiment includes: an exhausting step of exhausting the gas in the inside of the vacuum chamber 31 to adjust the inside of the vacuum chamber 31 to the initial pressure $P_0$ or less; a preparing step of, when the pressure in the vacuum chamber 31 is adjusted to $P_0$ or less and the heat generation element 42 disposed in the vacuum chamber 31 is not heated, introducing a raw material gas into the vacuum chamber 31 to adjust the pressure in the vacuum chamber 31 to $P_0$; and a film forming step of forming the gas barrier thin film on the surface of the plastic molded body 4 accommodated in the vacuum chamber 31 by heating the heat generation element 42 while the raw material gas is continuously introduced into the vacuum chamber 31.

The production method according to the second embodiment is different from the production method according to the first embodiment in terms of the following two points. The first point is the type of the heat generation element 42. In the first embodiment, the heat generation element 42 has a tantalum carbide phase, whereas in the second embodiment, the material of the heat generation element 42 is not limited. The second point is the type of the raw material gas to be used. In the first embodiment, the raw material gas is a silicon-containing hydrocarbon gas, whereas in the second embodiment, the raw material gas is not limited to the silicon-containing hydrocarbon gas. The production method according to the second embodiment is set to have the same basic configuration as in the production method according to the first embodiment except the above-described two points. For this reason, the description of the common configuration will not be provided but only different points will be described.

In the second embodiment, the material of the heat generation element is not particularly limited, but the heat generation element preferably contains one or two or more elements selected from the group consisting of C, W, Ta, Nb, Ti, Hf, V, Cr, Mo, Mn, Tc, Re, Fe, Ru, Os, Co, Rh, Ir, Ni, Pd, and Pt. Among these, the heat generation element preferably contains one or two or more metal elements selected from the group consisting of Ta, W, Mo, and Nb, for example. The material including a metal element is a pure metal, an alloy, a metal containing an additive, or an alloy or intermetallic compound. A metal forming the alloy or intermetallic compound may be a combination of two or more of the above-described metals or a combination of the above-described metals with other metal. The other metal is, for example, chromium. The alloy or intermetallic compound preferably contains one or two or more metal elements selected from the group consisting of Ta, W, Mo, and Nb at 80 atomic % or more in total. The additive is an oxide such as zirconia, yttria, calcia, or silica, for example. The amount of the additive added is preferably 1% by mass or less.

In the second embodiment, examples of a raw material gas other than the aforementioned silicon-containing hydrocarbon gas may include an alkane-based gas such as methane, ethane, propane, butane, pentane, or hexane; an alkene-based gas such as ethylene, propylene, or butyne; an alkadiene-based gas such as butadiene or pentadiene; an alkyne-based gas such as acetylene or methylacetylene; an aromatic hydrocarbon gas such as benzene, toluene, xylene, indene, naphthalene or phenanthrene; a cycloalkane-based gas such as cyclopropane or cyclohexane; a cycloalkene-based gas such as cyclopentene or cyclohexene; an alcohol-based gas such as methanol or ethanol; a ketone-based gas such as acetone or methyl ethyl ketone; or an aldehyde-based gas such as formaldehyde or acetaldehyde.

EXAMPLES

Next, the present invention will be described by way of Examples, but the present invention is not limited to these Examples.

Example 1

A gas barrier plastic molded body was produced using the film forming apparatus illustrated in FIG. 2. A PET plastic bottle (internal capacity: 500 ml) was used as the plastic molded body, vinylsilane was used as the silicon-containing hydrocarbon gas, and a tantalum carbide wire (φ0.5 mm) was used as the heat generation element. First, the exhausting step was carried out as follows. In the exhausting step, the gas in the inside of the vacuum chamber was exhausted to adjust the inside of the vacuum chamber to the initial pressure $P_0$=1.5 Pa or less. Then, the preparing step was carried out as follows. In the preparing step, after the gate valve was opened, the silicon-containing hydrocarbon gas was introduced into the vacuum chamber to adjust the pressure in the vacuum chamber to $P_0$Pa and then the pressure in the vacuum chamber was caused to reach $P_A$Pa higher than $P_0$Pa. Further, the plastic bottle was descended from the insertion/extraction chamber and then the heat generation element and the raw material gas supply pipe were inserted into the inside of the plastic bottle. Next, the film forming step was carried out as follows. In the film forming step, the heating of the heat generation element was started while the introduction of the silicon-containing hydrocarbon gas was continued, the heat generation element was heated to 2100 to 2200° C., and the heating of the heat generation element was stopped when the thin film deposited on the inner surface of the plastic bottle reached 20 nm. Thereafter, the plastic bottle was returned to the insertion/extraction chamber, the gate valve was closed, and then the supply of the gas was stopped. Further, in the film forming step, the pressure in the vacuum chamber was caused to reach $P_B$Pa higher than $P_A$Pa. The pressures $P_A$ and $P_B$ in each step were adjusted to satisfy $(P_B-P_A)/P_0$=0.16. After the completion of the film forming step, the inside of the insertion/extraction chamber was exposed to the atmospheric air, the obtained gas barrier plastic molded body was extracted, a new untreated plastic bottle was input, and then the open/close gate was closed. The series of these film forming operations was repeatedly performed.

Example 2

A gas barrier plastic molded body was produced in the same manner as in Example 1, except that the pressures $P_A$ and $P_B$ in each step were adjusted to satisfy $(P_B-P_A)/P_0=0.15$.

Example 3

A gas barrier plastic molded body was produced in the same manner as in Example 1, except that the pressures $P_A$ and $P_B$ in each step were adjusted to satisfy $(P_B-P_A)/P_0=0.11$.

Comparative Example 1

A gas barrier plastic molded body was produced in the same manner as in Example 1, except that a tantalum wire (φ0.5 mm) not subjected to carbonization treatment was used as the heat generation element, the preparing step was not performed, and the film thickness of the thin film was changed to 36 nm.

(XPS Analysis-Composition Analysis)

The surfaces of the thin films of the plastic bottles obtained at the first time of a series of film forming operations in Example 1 and Comparative Example 1 were analyzed using an XPS apparatus (type: QUANTERASXM, manufactured by ULVAC-PHI, Inc.). The ratios of constituent elements at the thin film surfaces are presented in Table 2. The conditions for the XPS analysis are as follows.

Measurement Conditions
Excited X-ray: Al mono
Detection region: 100 μmφ
Extraction angle: 90 deg
Detection depth: about 8 nm

TABLE 2

|  | Element ratio[atomic %] | | |
| --- | --- | --- | --- |
|  | Si | O | C |
| Example 1 | 26.4 | 14.3 | 59.3 |
| Comparative Example 1 | 33 | 29.5 | 37.5 |

(XPS Analysis-Binding Energy)

The surfaces of the thin films of the plastic bottles obtained at the first time of the series of film forming operations in Example 1 and Comparative Example 1 were analyzed using the above-described XPS apparatus under Condition (1). The test pieces and analysis conditions were the same as in the composition analysis.

Figure 4:
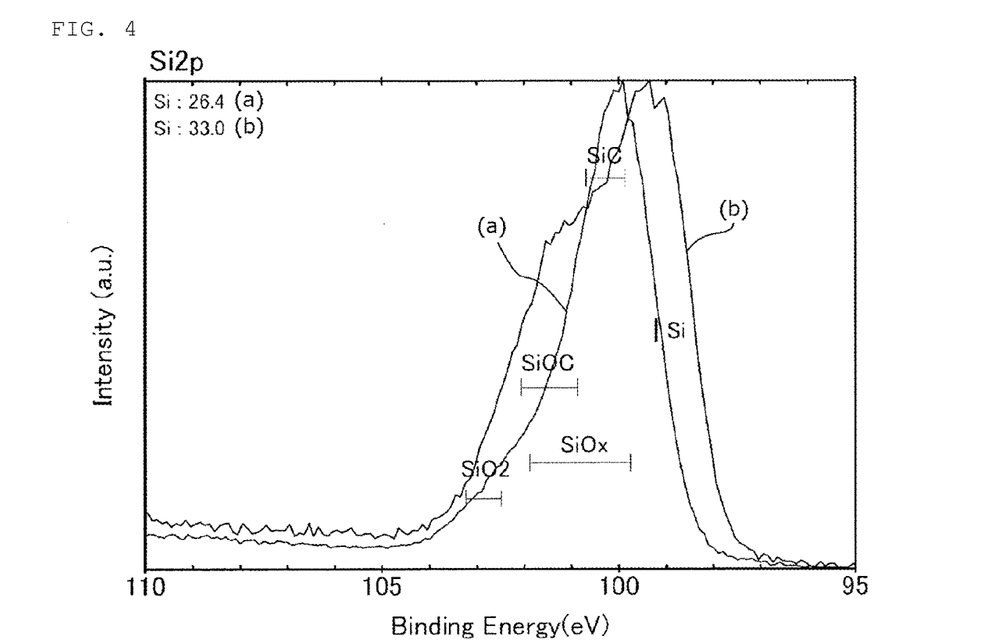
FIG. 4 is a narrow-scan spectrum of Si2p obtained by subjecting a thin film surface to an XPS analysis under Condition (1), in which (a) is a thin film of Example 1 and (b) is a thin film of Comparative Example 1.

FIG. 4 is a narrow-scan spectrum of Si2p obtained by subjecting a thin film surface to an XPS analysis under Condition (1), in which (a) is a thin film of Example 1 and (b) is a thin film of Comparative Example 1. As illustrated in FIG. 4, the main peak was observed at the peak appearance position of binding energy of Si—C in Example 1, whereas the main peak was observed at the peak appearance position of binding energy of Si—Si in Comparative Example 1.

(XPS Analysis-Depth Profile Analysis)

The depth profiles of the thin films of the plastic bottles obtained at the first time of the series of film forming operations in Example 1 and Comparative Example 1 were analyzed using the above-described XPS apparatus while argon ion etching was performed. The test pieces and analysis conditions were the same as in the composition analysis. Herein, when a case in which the gas barrier thin film is bisected in the depth direction is considered, a 10-nm opposite side to the plastic molded body was regarded as an upper layer and a 10-nm plastic molded body side was regarded as a lower layer in Example 1 and 18-nm opposite side to the plastic molded body was regarded as an upper layer and a 18-nm plastic molded body side was regarded as a lower layer in Comparative Example 1.

Figure 5:
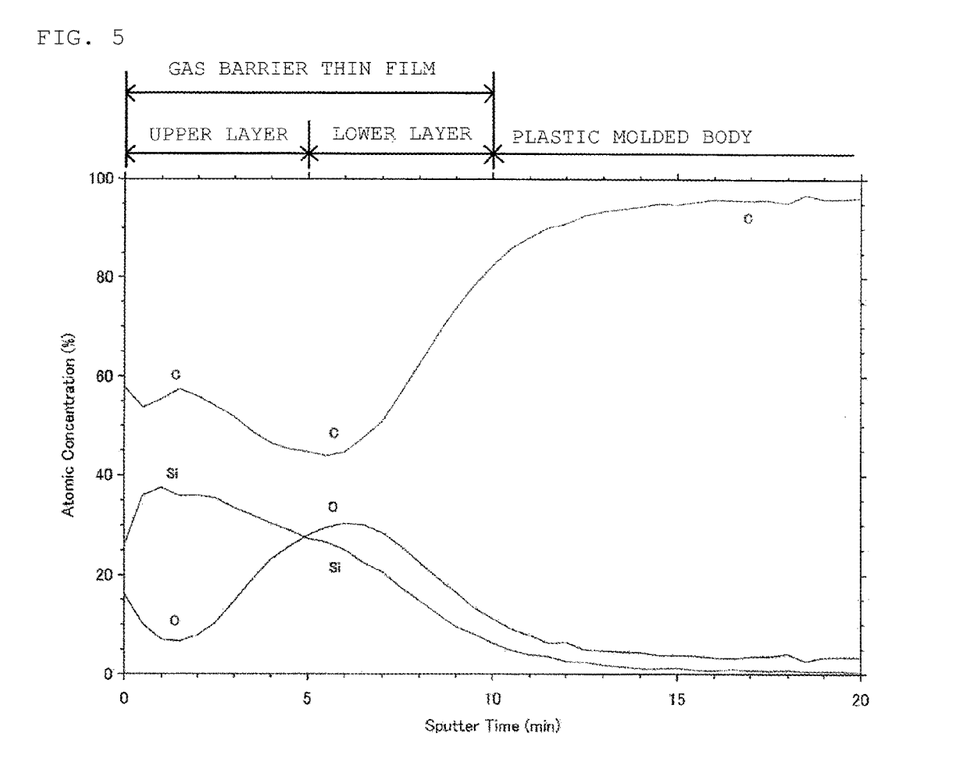
FIG. 5 is a depth profile of Example 1.

FIG. 5 is a depth profile of Example 1. In FIG. 5, since the O and C profiles have one extreme value in each of the upper layer and the lower layer, the O profile having the highest priority order was selected and the content percentages of Si, C, and O in the extreme values of the O profile were compared with one another. In FIG. 5, regarding the extreme values of the O profile, the minimum value was at Sputter Time 1.5 min included in the upper layer and the maximum value was at Sputter Time 6.0 min included in the lower layer. In Example 1, as illustrated in FIG. 5, the C content percentage at Sputter Time 1.5 min was higher than the Si content percentage at Sputter Time 1.5 min. In addition, in Example 1, as illustrated in FIG. 5, the O content percentage at Sputter Time 1.5 min was lower than the Si content percentage at Sputter Time 1.5 min. From this description, it was confirmed that in the composition in the extreme values of the O profile in the upper layer, the C content percentage is the highest, the Si content percentage is the secondary highest, and the O content percentage is the lowest in Example 1.

Figure 6:
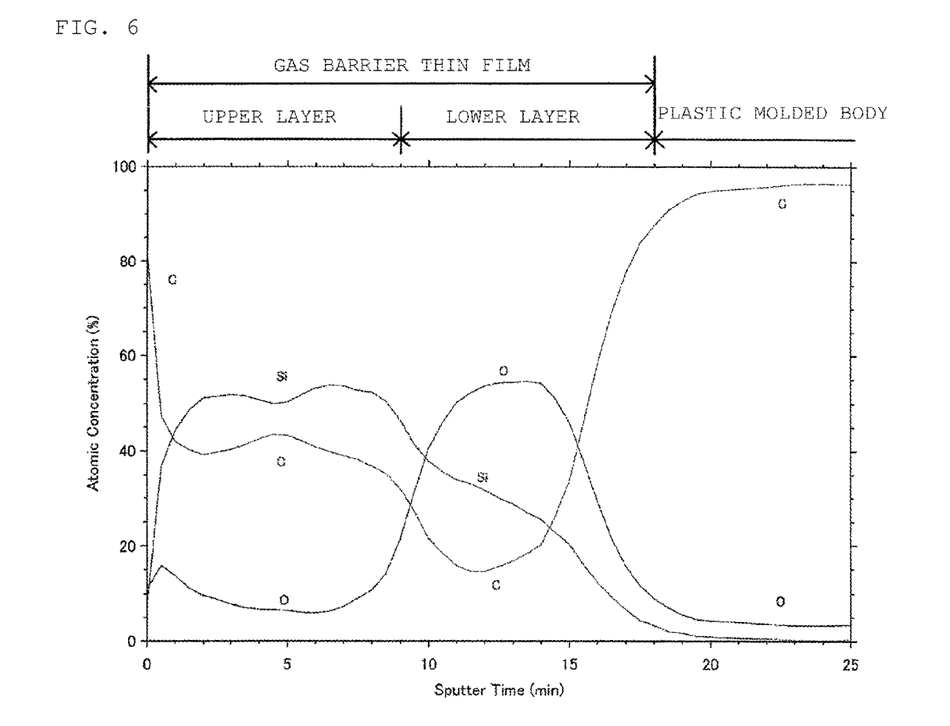
FIG. 6 is a depth profile of Comparative Example 1.

FIG. 6 is a depth profile of Comparative Example 1. In FIG. 6, since the O and C profiles have one extreme value in each of the upper layer and the lower layer, the O profile having the highest priority order was selected and the content percentages of Si, C, and O in the extreme values of the O profile were compared with one another. In FIG. 6, regarding the extreme values of the O profile, the minimum value was at Sputter Time 6.0 min included in the upper layer and the maximum value was at Sputter Time 13.5 min included in the lower layer. In Comparative Example 1, as illustrated in FIG. 6, the C content percentage at Sputter Time 6.0 min was lower than the Si content percentage at Sputter Time 6.0 min. In addition, in Comparative Example 1, as illustrated in FIG. 6, the O content percentage at Sputter Time 6.0 min was lower than the Si content percentage at Sputter Time 6.0 min. From this description, it was confirmed that the Si content percentage is the highest in the composition in the extreme values of the O profile in the upper layer in Comparative Example 1.

In FIG. 5, when the integrated value of each atomic concentration of Si, C, and O in the upper layer is obtained, it was confirmed that in the upper layer, the C content percentage is the highest, the Si content percentage is the secondary highest, and the O content percentage is the lowest in Example 1. In addition, in FIG. 6, when the integrated value of each atomic concentration of Si, C, and O in the upper layer is obtained, it was confirmed that in the upper layer, the Si content percentage is the highest, the C content percentage is the secondary highest, and the O content percentage is the lowest in Comparative Example 1.

Further, in Example 1, as illustrated in FIG. 5, the C content percentage at Sputter Time 6.0 min was higher than the Si content percentage at Sputter Time 6.0 min, and the O content percentage at Sputter Time 6.0 min was higher than the Si content percentage at Sputter Time 6.0 min. On the other hand, in Comparative Example 1, as illustrated in FIG. 6, the C content percentage at Sputter Time 13.5 min was lower than the Si content percentage at Sputter Time 13.5 min, and the O content percentage at Sputter Time 13.5 min was higher than the Si content percentage at Sputter Time 13.5 min.

In FIG. 5, when the integrated value of each atomic concentration of Si, C, and O in the lower layer is obtained, it was confirmed that in the lower layer, the C content percentage is the highest, the O content percentage is the secondary highest, and the Si content percentage is the lowest in Example 1. In addition, in FIG. 6, when the integrated value of each atomic concentration of Si, C, and O in the lower layer is obtained, it was confirmed that in the lower layer, the O content percentage is the highest, the Si content percentage is the secondary highest, and the C content percentage is the lowest in Comparative Example 1.

(Evaluation of Transparency)

The transparency was evaluated by using the plastic bottles obtained at the first time of the series of film forming operations in Examples and Comparative Examples. The transparency was evaluated by the b* value. The b* value was measured using an automatic recording spectrophotometer (U-3900 type, manufactured by Hitachi, Ltd.) attached with a 60Φ integrating sphere attachment device (for infrared/visible/near-infrared ranges) manufactured by the same company. Regarding the detector, an ultra-high sensitivity photomultiplier tube (R928: for ultraviolet/visible ranges) and a cooling type PbS (for near-infrared range) were used. Regarding the measurement wavelength, the transmittance was measured in a wavelength range of from 380 nm to 780 nm. By measuring the transmittance of the PET bottle, the transmittance measurement of the gas barrier thin film only can be calculated; however, the b* value of this Example directly represents a value calculated in a form also involving the absorptivity of the PET bottle. The test pieces used in glossiness measurement were used for measurement. An average value of three test pieces was presented in Table 3 as the b* value.

(Evaluation of Gas Barrier Properties)

The gas barrier properties were evaluated using each plastic bottle obtained at the number of times of repetition of once, 100 times, and 200 times of the series of film forming operations in Examples and Comparative Examples. The gas barrier properties were evaluated by BIF. First, the oxygen permeability of each plastic bottle of Examples or Comparative Examples was measured. The oxygen permeability was measured using an oxygen permeability measuring apparatus (type: Oxtran 2/20, manufactured by Modern Controls, Inc.) under the conditions of 23° C. and 90% RH, conditioning was carried out for 24 hours from the initiation of measurement and the oxygen permeability was designated as the value obtained after the passage of 72 hours from the initiation of measurement. Regarding BIF, in Mathematical Formula 5, the oxygen permeability value of the bottle without a thin film formed therein was calculated as the oxygen permeability of the plastic molded body without a thin film formed therein and the oxygen permeability value of each plastic bottle in Examples or Comparative Examples was calculated as the oxygen permeability of the gas barrier plastic molded body. The evaluation criteria are as follows. The evaluation results are presented in Table 3.

⊚: The BIF of each plastic bottle is 10 or more (practical use level).
○: The BIF of each plastic bottle is 5 or more and less than 10 (lower limit for practical use level).
x: The BIF of each plastic bottle is less than 5 (inappropriate level for practical use).

(Evaluation of Mechanical Endurance)

After the series of film forming operations was repeated 10,000 times, the heat generation element was extracted from the film forming apparatus and then a portion apart from the returned portion by 40 to 80 mm was gripped with fingers to confirm the strength. The evaluation criteria are as follows. The evaluation results are presented in Table 3.
○: The heat generation element straight wire portion is maintained in a range of ±1.5 mm and there is no breakage even by gripping with fingers (practical use level).
Δ: The heat generation element straight wire portion is maintained in a range of ±3.0 mm and there is no breakage even by gripping with fingers (lower limit for practical use level).
x: The heat generation element straight wire portion is maintained in a range of more than ±3.0 mm and there is breakage by gripping with fingers (inappropriate level for practical use).

TABLE 3

| | | Transparency b* value | Gas barrier properties | | Mechanical endurance |
|---|---|---|---|---|---|
| | $(P_B - P_A)/P_0$ | | Number of times of repetition | Determination | |
| Example 1 | 0.16 | 1.2 | Once | ⊚ | ○ |
| | | | 100 times | ⊚ | |
| | | | 200 times | ⊚ | |
| Example 2 | 0.15 | 1.4 | Once | ⊚ | ○ |
| | | | 100 times | ⊚ | |
| | | | 200 times | ⊚ | |
| Example 3 | 0.11 | 0.9 | Once | ⊚ | ○ |
| | | | 100 times | ○ | |
| | | | 200 times | ○ | |
| Comparative Example 1 | — | 7.0 | Once | ⊚ | X |
| | | | 100 times | X | |
| | | | 200 times | X | |

As presented in Table 3, all of respective Examples were substantially colorless and transparent and had high gas barrier properties. In addition, as comparing with Comparative Example 1, it could be confirmed that the production methods in Examples are excellent in endurance as well as the catalytic activity and strength of the heat generation element. In particular, in Example 1 and Example 2, even when the heat generation element was repeatedly used 10,000 times or more, the catalytic activity of the heat generation element was not lost and it was possible to form a thin film having high gas barrier properties. Furthermore, in respective Examples, $(P_B-P_A)/P_0$ was 0.11 or more and it was possible to form a gas barrier thin film having high transparency and high gas barrier properties. In Examples 1 and 2, $(P_B-P_A)/P_0$ was 0.15 or more, and even when the heat generation element was repeatedly used, high gas barrier properties were maintained.

REFERENCE SIGNS LIST

4 PLASTIC MOLDED BODY (PLASTIC BOTTLE)
31 FILM FORMATION DEDICATED CHAMBER (VACUUM CHAMBER)
32 INSERTION/EXTRACTION CHAMBER
33 GATE VALVE
42 HEAT GENERATION ELEMENT

56 OPEN/CLOSE GATE
80 PRESSURE DETECTOR
VP1 VACUUM PUMP
VP2 VACUUM PUMP
90 GAS BARRIER PLASTIC MOLDED BODY
91 PLASTIC MOLDED BODY
92 GAS BARRIER THIN FILM
92a UPPER LAYER
92b LOWER LAYER
92s SURFACE OF GAS BARRIER THIN FILM

The invention claimed is:

1. A gas barrier plastic molded body comprising a plastic molded body and a gas barrier thin film provided on a surface of the plastic molded body, wherein
the gas barrier thin film contains silicon (Si), carbon (C), and oxygen (O) as constituent elements and has a region, in which a main peak is observed, at a peak appearance position of binding energy of Si—C when the gas barrier thin film is subjected to an X-ray photoelectron spectroscopic analysis under Condition (1):
the gas barrier thin film has a gradient composition in a depth direction, and
when the gas barrier thin film is bisected in the depth direction so that an opposite side to the plastic molded body is regarded as an upper layer and the plastic molded body side is regarded as a lower layer,
wherein both the upper layer and the lower layer have a series of gradient compositions without any boundary between the layers,
an O content percentage represented by (Mathematical Formula 3) in the upper layer is lower than a Si content percentage represented by (Mathematical Formula 2) in the upper layer:

Condition (1): a measurement range is set to 95 to 105 eV,

Si content percentage [%]={(Si content [atomic %])/ (total content of Si, O, and C [atomic %])}× 100,    (Mathematical Formula 2)

O content percentage [%]={(O content [atomic %])/ (total content of Si, O, and C [atomic %])}× 100.    (Mathematical Formula 3)

2. The gas barrier plastic molded body according to claim 1, wherein
a C content percentage represented by (Mathematical Formula 1) in the upper layer is higher than the Si content percentage represented by (Mathematical Formula 2) in the upper layer:

C content percentage [%]={(C content [atomic %])/ (total content of Si, O, and C [atomic %])}× 100.    (Mathematical Formula 1)

3. The gas barrier plastic molded body according to claim 1, wherein
the gas barrier thin film has a gradient composition in a depth direction, and
when the gas barrier thin film is bisected in the depth direction so that an opposite side to the plastic molded body is regarded as an upper layer and the plastic molded body side is regarded as a lower layer,
a C content percentage represented by (Mathematical Formula 1) in the lower layer is higher than the O content percentage represented by (Mathematical Formula 3) in the lower layer:

C content percentage [%]={(C content [atomic %])/ (total content of Si, O, and C [atomic %])}× 100.    (Mathematical Formula 1)

* * * * *